US006759791B2

(12) United States Patent
Hatangadi et al.

(10) Patent No.: US 6,759,791 B2
(45) Date of Patent: Jul. 6, 2004

(54) MULTIDIMENSIONAL ARRAY AND FABRICATION THEREOF

(76) Inventors: Ram Hatangadi, 5441 W. Folley St., Chandler, AZ (US) 85226; Sanjay Chandran, 1258 W. Myrna La., Tempe, AZ (US) 85284; Dave Chartrand, 1530 N. Lewis St., Mesa, AZ (US) 85201

( * ) Notice: Subject to any disclaimer, the term of this patent is extended or adjusted under 35 U.S.C. 154(b) by 0 days.

(21) Appl. No.: 09/746,276

(22) Filed: Dec. 21, 2000

(65) Prior Publication Data

US 2003/0009873 A1 Jan. 16, 2003

(51) Int. Cl.[7] .......... H01L 41/04

(52) U.S. Cl. .......... 310/334; 310/322; 310/326

(58) Field of Search .......... 310/322, 326, 310/327, 334

(56) References Cited

U.S. PATENT DOCUMENTS

| | | | | | |
|---|---|---|---|---|---|
| 4,211,949 | A | * | 7/1980 | Brisken et al. | 310/322 |
| 4,440,025 | A | * | 4/1984 | Hayakawa et al. | 73/642 |
| 5,297,553 | A | * | 3/1994 | Sliwa, Jr. et al. | 600/459 |
| 5,706,252 | A | * | 1/1998 | Le Verrier et al. | 367/152 |
| 5,792,058 | A | * | 8/1998 | Lee et al. | 600/459 |
| 6,043,589 | A | * | 3/2000 | Hanafy | 310/335 |
| 6,341,408 | B2 | * | 1/2002 | Bureau et al. | 29/25.35 |
| 6,415,485 | B1 | * | 7/2002 | Hanafy | 29/25.35 |

FOREIGN PATENT DOCUMENTS

| | | | |
|---|---|---|---|
| EP | 0 294 826 A | 12/1998 | G10K/11/34 |

* cited by examiner

*Primary Examiner*—Thomas M. Dougherty
(74) *Attorney, Agent, or Firm*—Carl B. Horton, Esq.; Armstrong Teasdale, LLP

(57) ABSTRACT

According to various aspects of the invention, a transducer is manufactured by providing a substrate assembly, making major element cuts in the substrate assembly in a first direction, making minor element cuts in the substrate assembly in a second direction, positioning a plurality of signal lines (such as a flex circuit) on the substrate assembly such that the plurality of signal lines is aligned with said minor element cuts, and making major element cuts in the substrate assembly in the second direction after said plurality of signal lines is positioned.

Various aspects of the invention also include a multi-dimensional transducer having a plurality of elements, wherein the transducer includes a conductor; a piezoelectric assembly assembled with said conductor and having a first plurality of cuts in a first direction; and a matching layer assembly having a second plurality of aperture cuts in the first direction, wherein the matching layer is coupled to the conductor opposite the piezoelectric assembly such that the first and second pluralities of elevation cuts are aligned to isolate the plurality of elements in an elevation dimension.

7 Claims, 7 Drawing Sheets

MULTIDIMENSIONAL ARRAY AND FABRICATION THEREOF

TECHNICAL FIELD OF THE INVENTION

This invention relates generally to transducers. More particularly, the invention relates to a 1.5 dimensional ultrasonic transducer array suitable for use in medical imaging, as well as to methods of transducer use and construction.

BACKGROUND OF THE INVENTION

Transducers are devices that convert electrical energy to mechanical energy, or vice versa. A common application of transducers is in ultrasonic imaging, which is often used in medical applications, non-destructive testing, and the like.

Transducers used for medical imaging typically include one or more transducer elements that may be matched to and driven by electronics connected to the transducer via a coaxial cable or the like. In an ultrasonic imaging application, for example, a typical transducer suitably converts an electrical signal generated by the electronics into mechanical vibrations (e.g. ultrasonic sound waves) that may be transmitted and reflected through the human body. The vibrations may be produced by one or more piezoelectric elements that suitably convert the electrical charge to acoustic (i.e. sound) energy. The transducer elements may also receive acoustic energy, which may be converted into electrical signals that may be processed by the attached electronics.

Frequently, transducers are sub-divided into transducer elements that may be individually and uniformly arranged along a straight or curvilinear axis, for example. Each transducer element is typically driven by an electric potential to produce an individual ultrasonic wave from that particular element. Each transducer element may be made up of a piezoelectric (e.g. ceramic) layer, a conducting layer, and one or more acoustic matching layers, as described, for example, in U.S. Pat. No. 5,637,800 issued Jun. 10, 1997 to Finsterwald et al. and incorporated herein by reference. Each element may be acoustically isolated from each of the other elements to prevent cross-talk and other error signals. The most common transducer elements are typically manufactured and arranged in a one-dimensional linear array that allows each element to be individually addressable by the associated electronics.

The individual waves generated by the various transducer elements produce a net ultrasonic wave or beam that may be focused at a selected point. If an electric signal is applied simultaneously to each element, the wave produced is typically relatively flat. By applying an electric signal at different time intervals to different elements, the net wave produced may become angled. In various embodiments, the net ultrasonic effect may be modeled as a gaussian wave. This net effect ultrasonic wave can frequently be "tuned" or "steered" to scan an image in an imaging plane by activating or deactivating individual elements of the transducer.

The 1-D array of piezoelectric transducer elements typically allows the beam of ultrasonic energy to be focused only in the azimuth (i.e. the lateral and axial directions) of the imaging plane, and not in the elevation plane. Objects that are not in the azimuth imaging plane of the beam generally exhibit lower resolutions because the 1D array cannot typically steer the beam in planes other than the azimuth.

The current shift to digital beamforming technology holds promise for regular and rapid increases in the number of channels in a medical imaging transducer. A common implementation of a 1D transducer typically utilizes 128 elements, while a fully sampled two-dimensional aperture typically utilizes of the order of 10000 elements. Additional channels typically result in additional expense and complexity, so it is of interest to evaluate how much performance can be improved with a moderate increment in channel count.

Many conventional 1-D phased array probes have very good lateral and axial resolution. This has been achieved by improvements in transducer technology, by the use of more sensitive pre-amplifiers, and better matching between the transducer elements and the transmit-receive electronics. One aspect of system performance that has received less attention in recent years, however, is that of beamwidth in the plane perpendicular to the imaging plane, often referred to as the "elevation beamwidth" or "slice thickness". There are two main reasons why slice thickness has received less attention than either lateral or axial resolution. First, changes in elevation beam width do not typically affect the display of a B-scan image as dramatically as changes in lateral and axial resolution. Second, building transducer arrays with the required elevation properties has been difficult since the already small elements must be further subdivided and independently controlled.

In order to make adjustments to the elevation beam width, multi-dimensional (e.g. 1.5-D and 2-D) arrays with additional beam-forming elements have been created to provide improved dynamic focusing and apodization. One technique for creating a multidimensional array involves the creation of additional elevation aperture strips within the transducer element. A one-dimensional transducer array typically utilizes 128 elements in the imaging plane that may be arranged in a single row. A 2-D array typically includes elements arranged into rows and columns with an elevational pitch that approaches an acoustic wavelength so that the beam may be steered and focused in both azimuth and elevation directions. A 1.5-D array is similar in that transducer elements are arranged into aperture and elevation strips, but that the elevational pitch remains relatively large such that beam focusing, but generally not beam steering, is possible in the elevation axis.

The creation of 1.5-D and 2-D arrays typically poses several problems. Adequately isolating aperture strips electrically and acoustically is one problem. U.S. Pat. No. 5,920,972 issued Jul. 13, 1999 to Palczewska et al. and incorporated herein by reference discloses a method of acoustically and electrically isolating individual aperture strips that uses a patterned conductive metallization bridge over the individual aperture strips to provide the electrical connections for each strip. This method, however, typically produces unwanted intra-element cross talk (e.g. electrical or acoustic interference between adjoining transducer elements).

A second problem common in multi-dimensional transducer arrays involves providing a reliable method of interconnecting the aperture strips. U.S. Pat. No. 5,617,865 issued Apr. 8, 1997 to Palczewska et al. and incorporated herein by reference, discloses a multidimensional array interconnecting aperture strips with a two sided flex circuit laminated over the piezoelectric, ceramic layer of the transducer. This method typically produces unwanted reflections from the flexible printed circuit and interferes with the pulse-echo response. Additionally, current methods for adequately isolating and interconnecting aperture strips are complicated and costly. U.S. Pat. No. 5,704,105 issued Jan. 6, 1998 to Venkataramani, et al. and incorporated herein by reference, for example, discloses another technique for creating 1.5-D and 2-D transducer arrays, but the technique described therein is complicated to implement and may not adequately isolate the various elements. It is therefore desirable to develop methods capable of efficiently creating a multidimensional array with adequately isolated and interconnected aperture strips.

SUMMARY OF INVENTION

According to various aspects of the invention, a transducer is manufactured by providing a substrate assembly, making aperture isolation cuts in the substrate assembly in a first direction, making minor element cuts in the substrate assembly in a second direction, positioning a plurality of signal lines (such as a flex circuit) on the substrate assembly such that the plurality of signal lines is aligned with said minor element cuts, and making major element cuts in the substrate assembly in the second direction after said plurality of signal lines is positioned.

Various aspects of the invention also include a multi-dimensional transducer having a plurality of elements, wherein the transducer includes a conductor; a piezoelectric assembly assembled with said conductor and having a first plurality of cuts in a first direction; and a matching layer assembly having a second plurality of aperture cuts in the first direction, wherein the matching layer is coupled to the conductor opposite the piezo-electric assembly such that the first and second pluralities of elevation cuts are aligned to isolate the plurality of elements in an elevation dimension.

BRIEF DESCRIPTION OF THE DRAWING

The above and other features and advantages are hereinafter described in the following detailed description of illustrative embodiments to be read in conjunction with the accompanying drawing figures, wherein like reference numerals are used to identify the same or similar parts in the similar views, and.

DESCRIPTION OF THE INVENTION

The exemplary embodiment of the invention disclosed herein primarily discusses the construction of a multi-dimensional array for use in a medical imaging transducer. However, any number of other embodiments fall within the ambit of the present invention. For example, the devices and techniques described herein could be used in conjunction with other types of transducer systems, such as audio loudspeakers, nondestructive evaluation, non-invasive surgeries, dentistry, and the like. Similarly, the techniques described herein in conjunction with 1.5-D arrays could also be used to implement a 2-D array, or any other multi-dimensional structure. Further, it will be appreciated that the alignment, spatial orientation, and relative positions of the various elements recited herein could be modified in any way without departing from the scope of the invention. For example, although the terms "azimuth" and "elevation" are used herein to simplify discussion, it would be possible to formulate transducer assemblies with any dimensions, array sizes, or orientations. Moreover, although traditional "single layer" piezoelectric elements are described herein, various equivalent structures such as multi-layer piezoelectric structures could be substituted. Multi-layer piezoelectric transducers are described, for example, in U.S. patent application Ser. No. 09/492,430 filed on Jan. 27, 2000, which is incorporated herein by reference.

As described above, a 1-D transducer array has limited capability to adjust the contrast resolution of an image. This limited capability is due to the fact that a typical 1-D array has only one aperture in the elevation direction, which typically limits the transducer to a single focal zone in the elevation plane. By increasing the number of aperture strips in the elevation dimension, the number of focal zones can be increased to thereby reduce slice thickness over a larger depth, which in turn improves contrast resolution.

Figure 1A:
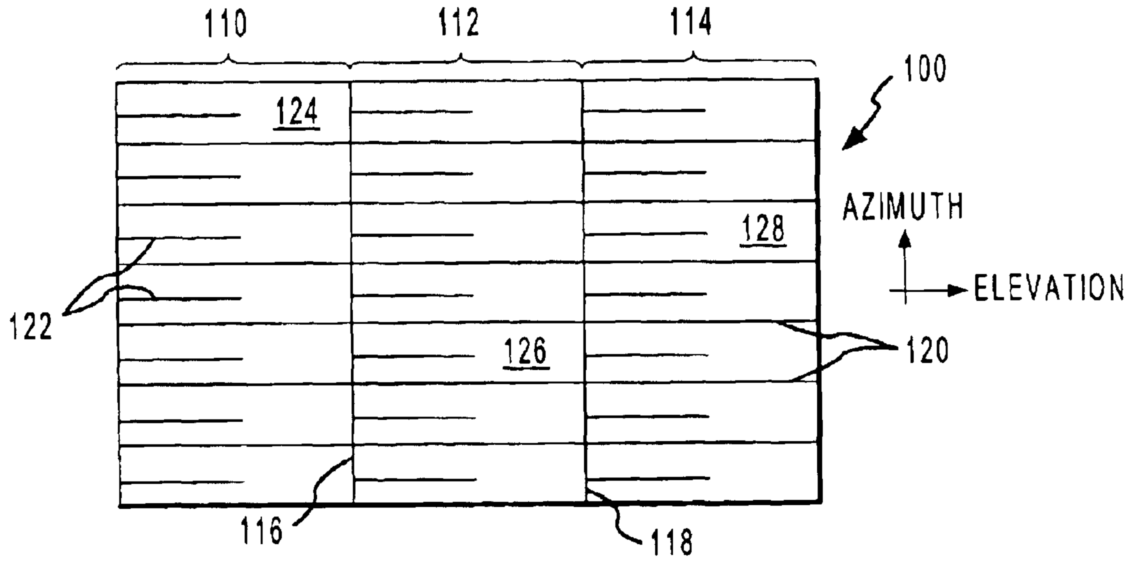
FIGS. 1(*a*) and 1(*b*) are a top and side views, respectively, of an exemplary transducer element.
Figure 1B:
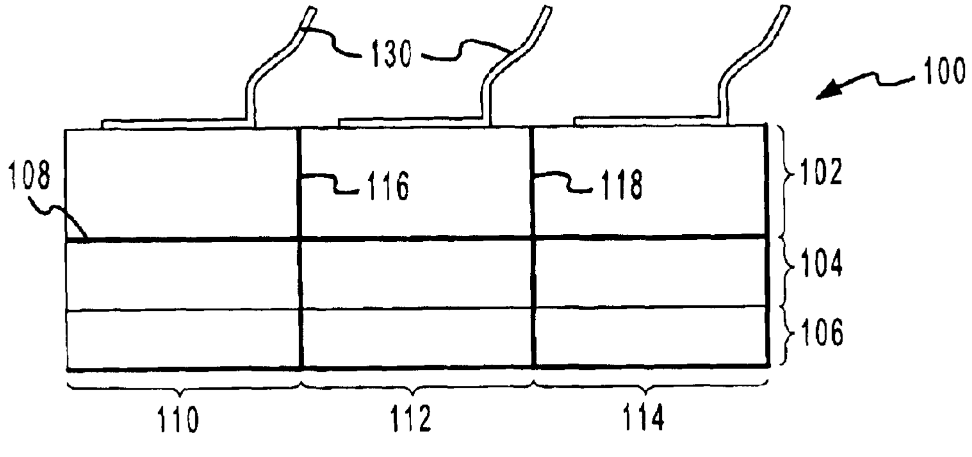

FIGS. 1(*a*) and 1(*b*) are top and side views, respectively, of an exemplary multidimensional transducer array 100. With reference now to FIG. 1, a number of elements (such as elements 124, 126 and 128) in the array are assembled into a two-dimensional matrix having an azimuth direction (e.g. the vertical axis of FIG. 1(*a*)) and an elevation direction (e.g. the horizontal axis in FIGS. 1(*a*) and 1(*b*)). Each element suitably includes a piezoelectric layer 102 and first and second matching layers 104 and 106, respectively. Piezoelectric layer 102 may be separated from matching layers 104 and 106 by a conducting layer 108, which may be connected to an electrical ground.

As an electric potential is applied across piezoelectric layer 102 in a particular element, that element may be made to vibrate at a resonant frequency to produce radiation (such as ultrasonic radiation). Electrical leads 130, each of which is attached to an individual transducer element, suitably apply the electric potential. Matching layers 104 and 106 suitably allow for efficient transfer of acoustic energy associated with the ultrasonic radiation to a human body or other object. By selectively activating and deactivating individual elements in transducer array 100, the net beam produced by the entire array may be adjusted. Hence, signals applied via signal lines 130 may be used to focus or steer the ultrasonic beam in a conventional transducer application, for example, thus improving the resolution of the transducer.

Although the various elements in the transducer array 100 may share common ground (e.g. conducting layer 108), it is typically desirable to otherwise isolate the various elements electrically and acoustically to prevent cross-talk, noise, and other sources of error. Isolation in the elevation direction may be achieved through elevation cuts 116 and 118, which may be filled with an acoustically attenuative material such as epoxy, as described more fully below. Isolation in the azimuth direction may be achieved with azimuth cuts such as cuts 120 in FIG. 1(*a*). Various elements may also include minor element cuts (such as cuts 122 in FIG. 1(*a*)) in the elevation direction to increase thickness mode vibrations of piezoelectric layer 102, thereby increasing the efficiency of transducer array 100.

Figure 2:
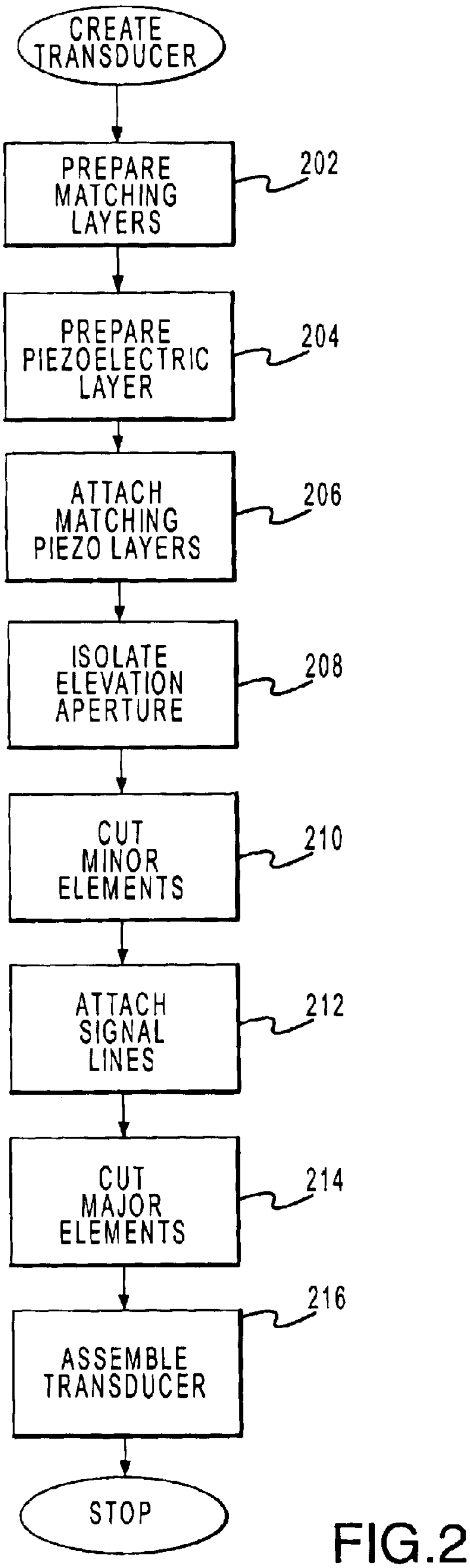
FIG. 2 is a flowchart of an exemplary process for creating a transducer.

FIG. 2 is a flowchart of an exemplary technique 200 for making a transducer. With reference now to FIG. 2, an exemplary technique 200 suitably includes preparing matching layer and piezoelectric layer assemblies (steps 202 and 204, respectively), attaching the piezoelectric and matching layer assemblies (step 206), isolating the elevation aperture (step 208), making minor element cuts (step 210), attaching the signal lines (step 212), making the major element cuts (step 214), and assembling the transducer (step 216). Of course other methods of creating a transducer may be used in other embodiments, or the order of the various processing steps may be modified without departing from the scope of the invention. For example, the matching layer and piezoelectric assemblies could be joined prior to completion of preparations on either or both assemblies.

Figure 3A:
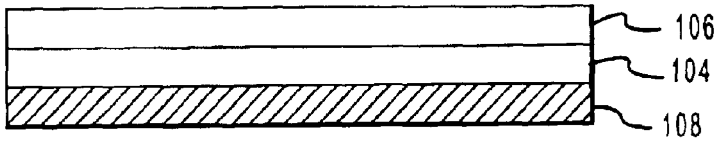
FIGS. 3(*a*), 3(*b*) and 3(*c*) are side views demonstrating an exemplary process for forming a matching layer assembly.
Figure 3B:
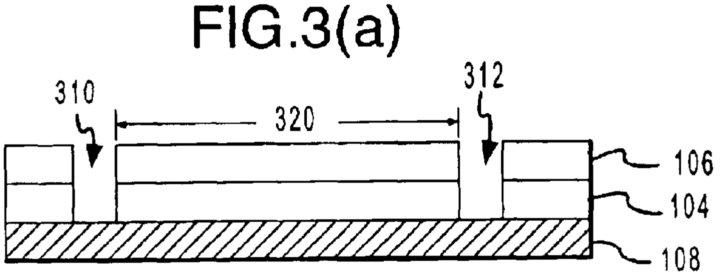
Figure 3C:
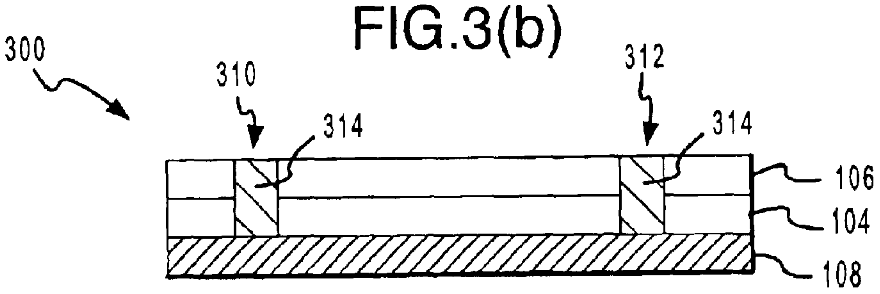
Figure 4A:
FIGS. 4(*a*)–(*d*) are side views demonstrating an exemplary process for forming a piezoelectric layer assembly.
Figure 4B:
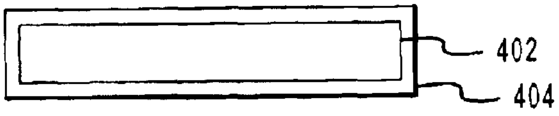
Figure 4C:
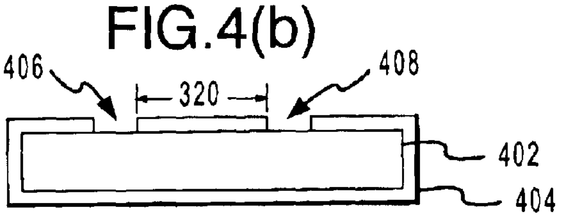
Figure 4D:
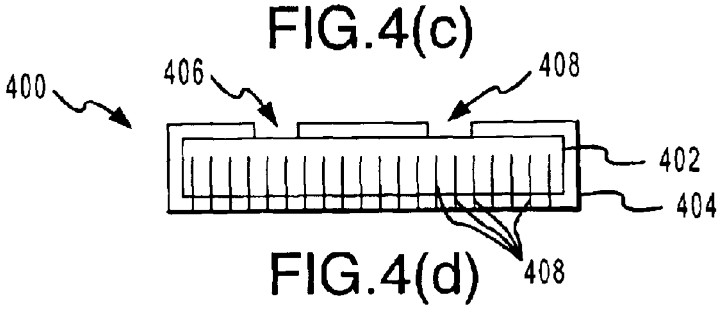

Step 202 of preparing a matching layer assembly 300 suitably includes forming one or more matching layers onto a conducting layer, as appropriate, and creating acoustic isolations in the matching layers in at least one dimension, such as the elevation dimension. FIGS. 3(*a*)–(*c*) exhibit one technique for forming a matching layer assembly 300. With reference now to FIG. 3, an exemplary matching layer assembly 300 suitably includes a conducting layer 108, a first acoustic matching layer 104, and a second acoustic matching layer 106. Conducting layer 108 is any electrical conducting material such as copper, aluminum, gold, silver, or the like. In an exemplary embodiment, conducting layer 108 is formed by depositing, sputtering, electroplating or otherwise coating a plate (such as a titanium plate) with a conductive material (such as gold, silver, copper, or the like).

Acoustic matching layers 104 and 106 are formed of a polymer or polymer composite material, or of any other suitable material. In a exemplary embodiment, the polymer material making up the first matching layer 104 is selected to be a polymer having an intermediate acoustic impedance value between that of the substrate and second acoustic matching layer 106. First matching layer 104 may be cast and ground to a desired thickness, as appropriate. For example, a uniform thickness equal to approximately one-quarter wavelength of the desired operating frequency, as measured by the speed of sound in the particular material selected, may be used. The speed of sound in the human body is approximately 1540 m/s, and an exemplary matching layer has a corresponding thickness of approximately 0.013 to 0.07 mm for a transducer ranging in frequency from about 3–6 MHz, although of course thicker or thinner matching layers could also be used. An exemplary material that is suitable for forming the first matching layer is HYSOL compound available from the Dexter Corporation, although other materials could be used in alternate embodiments.

The second acoustic matching layer 106 is similarly chosen to exhibit an intermediate acoustic impedance value between that of the first acoustic matching layer and that of the material with which the transducer is to make contact (e.g. the human body). In an exemplary embodiment, the second acoustic matching layer may be made from any conventional matching layer material (such as any material similarly to that used for the first acoustic matching layer), with appropriate acoustic properties. The material is suitably cast or otherwise formed over matching layer 104 and ground to a desired thickness, which may be equal to approximately one-quarter wavelength of the desired operating frequency as measured by the speed of sound in the particular epoxy or other material selected. In various embodiments, the material is ground to slightly (e.g. approximately 0.25 millimeters or so) more than the desired thickness to compensate for further processing steps. An exemplary embodiment uses a desired thickness of approximately 0.09–0.05 mm for a transducer ranging in frequency from about 3–6 MHz. Note that the figures do not necessarily show the various layers to scale, and actual layer thickness will depend upon particular applications and choices of materials.

With reference now to FIG. 3(*b*), after matching layers 104 and 106 are cast, parallel cuts 310 and 312 may be made in the matching layers to isolate individual elevation aperture strips. Cuts 310 and 312 may be made with any cutting technique, such as with a dicing saw. The cuts are made to any depth sufficient to create acoustic isolation between elements, and this depth will vary from embodiment to embodiment. In an exemplary embodiment, cuts are made through matching layers 104 and 106 to within about 0.4 mm or so of conducting layer 108.

Distance 320 suitably corresponds to the size of the various elements in the elevation direction, and may vary dramatically from embodiment to embodiment. The distance may be determined by, for example, dividing the surface area of the transducer by the desired number of elements in the elevation dimension, by using the "equal area method" (wherein the combined area of outer rows is approximately equal to the area of the center row so that electrical impedances and acoustic sensitivities are approximately equal), by using the minimum integrated absolute time delay error (MIAE) technique, or by any other technique. The MIAE approach may involve reducing or minimizing the integrated absolute time delay error along the axis of the transducer due to the geometrical discretization of the elevation aperture to yield a narrower far-field beam width. More detail about the MIAE approach is provided in D. G. Wildes, Chiao R. Y., C. M. W Daft, K. W. Rigby, L. S. Smith, K. E. Thomenius, "Elevation Performance of 1.25D and 1.5D Transducer Arrays," *IEEE transactions on Ultrasonics, Ferroelectrics, and Frequency Control*, Vol. 44, No. 5, September 1997, which is incorporated herein by reference. In an exemplary transducer having five elements in the elevation direction, for example, the middle rows may begin at a distance of about 0.458 times half the elevation aperture, and the outer rows may begin at a distance of about 0.754 times half the elevation aperture, as appropriate. Again, the spacing of the various rows may be according to any technique, and will vary widely from embodiment to embodiment.

Although only two elevation aperture cuts 310 and 312 are shown in FIG. 3, any number of elevation aperture cuts could be made depending upon the particular implementation. Cutting two grooves, for example, suitably creates three aperture strips corresponding to one center strip and two outer strips. The two outer strips may be connected in various embodiments to create one focal point that may be selectively activated or deactivated, as appropriate. The number of elevation aperture cuts, then, may be determined by the amount of focusing desired in the elevation direction. Cutting four grooves suitably produces 5 aperture strips (corresponding to three focal points if the outer strips (as well as the next-to-outermost strips) are connected together. In an exemplary embodiment, 6 grooves producing 7 aperture strips and 4 focal points suitably provides high resolution and a large depth of field as compared to a one-dimensional transducer array.

With reference now to FIG. 3(*c*), an acoustically attenuative compound 314 may be cast into aperture cuts 310 and 312 to improve acoustic isolation between elements. The compound used is an acoustically attenuative polymer or any other material with attributes such that attenuation, longitudinal and shear acoustic velocities, and acoustic impedance are appropriately suited to the properties of the matching layers (see FIG. 8 and accompanying text below). In various embodiments, compound 314 substantially minimizes (or at least reduces) the propagation of Lamb wave modes (i.e. surface waves) between the two matching layer strips. In an exemplary embodiment, attenuative compound 314 may be a filled polyurethane having a shore hardness A80 available from Ciba corporation. After compound 314 is placed, the compound may be cured as appropriate and matching layer assembly 300 may be cut to any desired size. Cutting may be performed with a saw or other device as appropriate.

With momentary reference again to FIG. 2, step 204 suitably involves preparing a piezoelectric assembly 400 that may be joined with matching layer assembly 300. FIGS. 4(*a*)–(*d*) are side views showing an exemplary technique for preparing piezoelectric assembly 400. With reference now to FIGS. 4(*a*)–(*d*), a selected substrate 402 (such as ceramic or another material having piezoelectric properties) may be made flat (e.g. by grinding) and suitably cut to a rectangular shape. Suitable substrate materials include ceramic or any other material having piezoelectric properties. In an exemplary embodiment, substrate 402 is PZT5H ceramic available from the (CTS) corporation. A conducting layer 404 may be applied to substrate 402 by any method, such as plating, electroplating, spray coating, vacuum deposition or any other metallization technique. One exemplary method of applying conductive coat 404 involves first etching the surfaces of substrate 402 with an acid solution (such as a 5% fluroboric acid solution) and then plating substrate 402 with electroless nickel using conventional plating techniques. Other materials that may be used for conductive coating 404 include solder, gold, silver, copper or any other conducting material. In various embodiments, conductive coating 404 is placed around the entire surface area of piezoelectric material 402. In other embodiments, only select faces (such as the upper and/or lower faces) of piezoelectric material 402 are coated with conducting material 404. For example, the plating material may be made to extend completely around four adjoining surfaces of the substrate such that a perimeter of the substrate is suitably covered with conductive material and two faces (corresponding to the front and back faces) of the substrate are left uncovered.

With reference now to FIG. 4(*c*), elevation aperture cuts 406 and 408 may be made in the piezoelectric layer 400 to improve electrical isolation between elements. In various embodiments cuts 406 and 408 are made through the conducting layer 404, which may be on the order of 0.013 millimeters or so in thickness. Aperture cuts 406 and 408 may be made with any technique, such as with a dicing saw. The width of cuts 406 and 408 varies dramatically by embodiment, but may be on the order of about 0.5 millimeters or so. Composite cuts 408 may also be made in piezoelectric assembly 400 with a dicing saw or other technique to facilitate later insertion of the transducer into a laminate or other shaping mechanism to create a desired internal focus radius. Composite cutting and transducer assembly techniques are discussed in great detail in, for example, the Finsterwald et al. patent previously incorporated herein by reference.

Figure 5A:
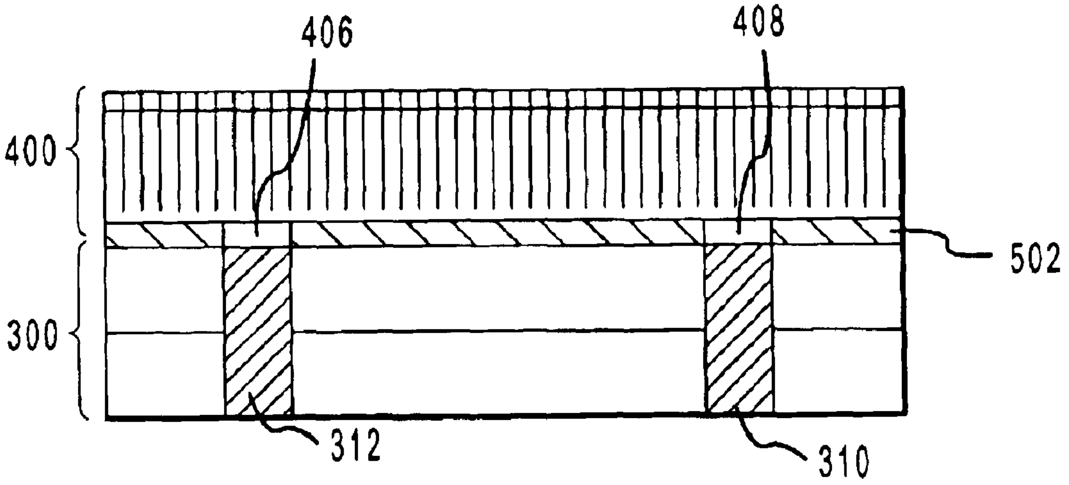
FIGS. 5(*a*) and 5(*b*) are side views demonstrating an exemplary process for isolating transducer elements in the elevation direction.
Figure 5B:
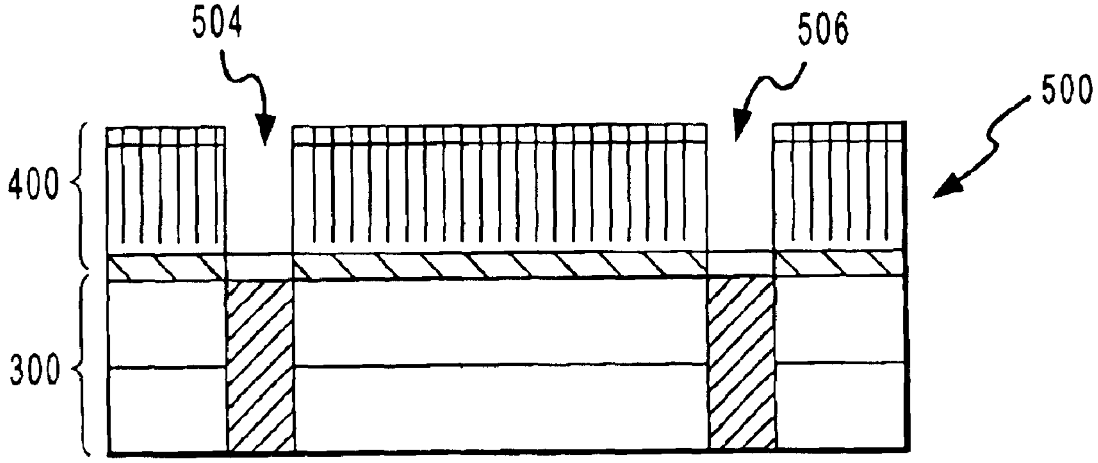

With momentary reference again to FIG. 2, after matching layer assembly 300 and piezoelectric assembly 400 are complete, the two assemblies may be joined as appropriate (step 206). FIG. 5(*a*) is a side view showing an exemplary process for joining the two assemblies (step 206). With reference now to FIG. 5(*a*), piezoelectric assembly 400 and matching layer assembly 300 are suitably aligned and placed such that the aperture cuts 406 and 408 in piezoelectric assembly 400 correspond to aperture cuts 312 and 310 in matching layer assembly 300. The two assemblies may be joined through any technique such as gluing, laminating, soldering, or the like. In an exemplary embodiment, the assemblies 300 and 400 are laminated to each other using a low-viscosity adhesive 502 such as EP-30V adhesive available from the MasterBond corporation, or any other suitable adhesive, applied between conducting layer 108 of matching layer assembly 300 and a metallized surface of piezoelectric assembly 400. In such embodiments, adhesive may fill gaps 406 and 408 in piezoelectric assembly 400.

After the two assemblies 300 and 400 are joined, the elements may be further isolated in the elevation dimension (step 208 in FIG. 2) by making further elevation aperture cuts 504 and 506 from the exposed surface of piezoelectric assembly 400 to gaps 406 and 408, or to any other depth. With reference now to FIG. 5(*b*), aperture cuts 504 and 506 may be made with a dicing saw or other device to acoustically isolate adjoining transducer elements. Isolation may be enhanced by filling the cuts with acoustically attenuative material, as described above in conjunction with material 314 and below in conjunction with FIG. 8. The material used is suitably a polymer having properties of attenuation, longitudinal and shear acoustic velocities, and acoustic impedance that suit the properties of the piezoelectric material. The polymer chosen may minimize (or at least reduce) lateral modes and cross-talk between ceramic aperture strips, as appropriate. The material used to fill cuts 504 and 506 may be identical to material 314 used in matching layer assembly 300, or the two materials may be different. For example, a material that may be used to fill elevation apertures 504 and 506 could be a filled polyurethane such as Shore A80 polyurethane available from Ciba Inc. After the acoustically-attenuative material is cured, a substrate assembly 500 having electrical and acoustic isolation between elements in the elevation direction is appropriately complete, and ready for processing in the azimuth direction.

Figure 6A:
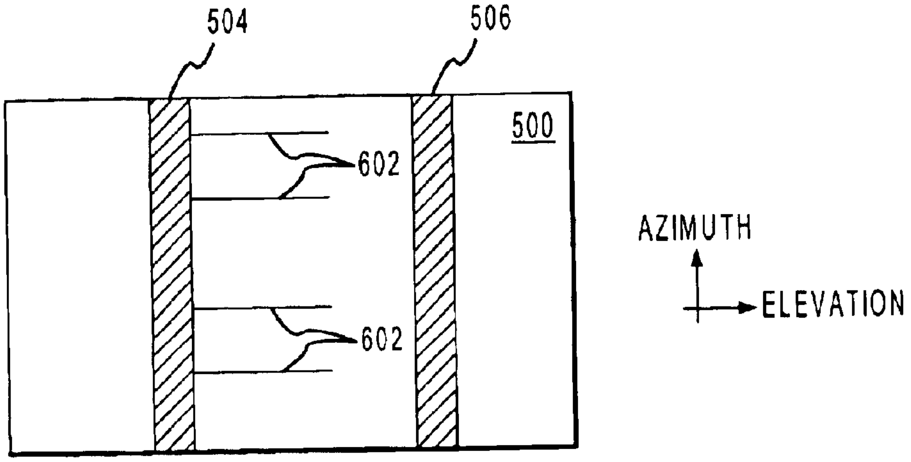
FIGS. 6(*a*), 6(*b*) and 6(*c*) are top views demonstrating an exemplary process for attaching circuit leads to transducer elements and for isolating transducer elements in the azimuth direction.
Figure 6B:
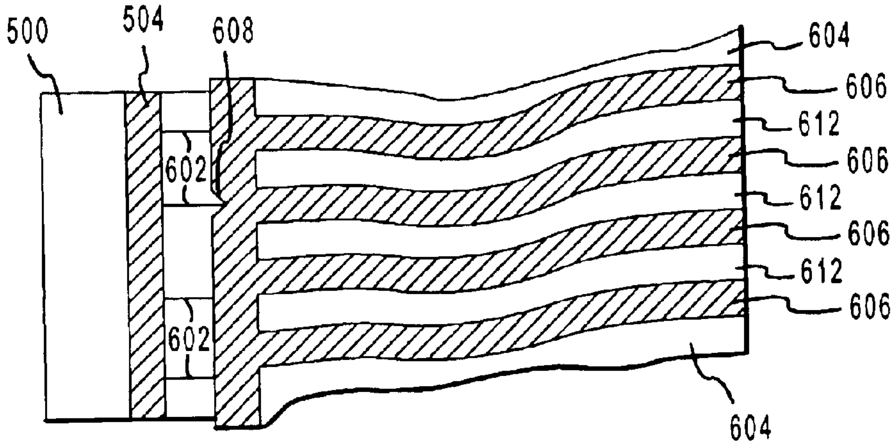
Figure 6C:
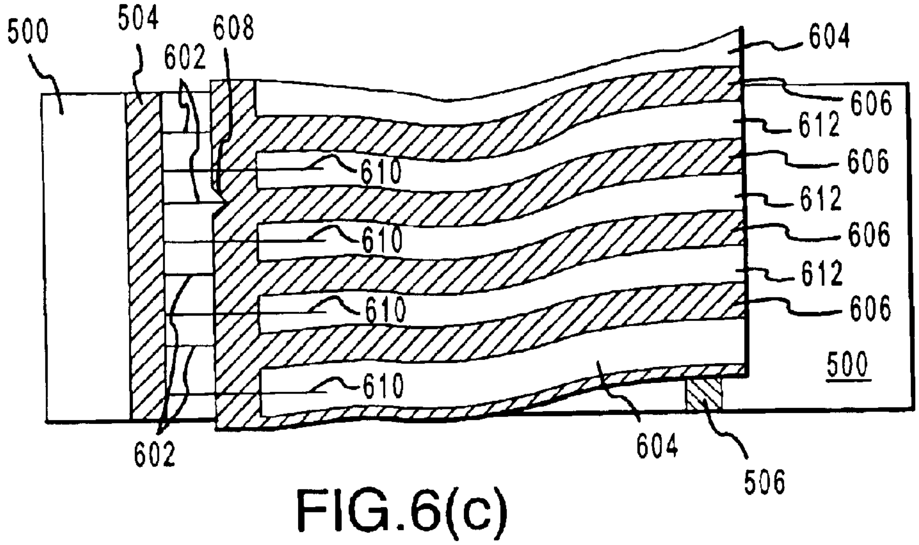

With momentary reference again to FIG. 2, processing the substrate assembly 500 in the azimuth direction suitably includes making minor element cuts (step 210), attaching signal leads (step 212), and making major element cuts in the elevation direction (step 214). FIGS. 6(*a*), (*b*), and (*c*) are exemplary-side top views of these respective steps. With reference now to FIG. 6(*a*), minor element cuts 602 are made in the elevation direction with a dicing saw or other device. Minor element cuts 602 may be made through the entire substrate assembly 500, as appropriate, or may be made only part of the way through substrate assembly 500 (e.g. only as far as conducting layer 108 (FIG. 1)). Minor element cuts 602 suitably increase the thickness mode vibration of the transducer element by producing "sub-elements", thus improving the efficiency of the transducer; nevertheless, minor element cuts are optional cuts that may be omitted in various alternate embodiments. The minor element cuts 602 (which correspond to minor element cuts 122 in FIG. 1) may be of any kerf width, such as on the order of about 5–100 microns. In an exemplary embodiment, the kerf width of the minor element cuts is about 30 microns, although of course other kerf widths could be used.

After the minor element cuts 602 are made in substrate assembly 500, signal leads 606 may be affixed as appropriate. With reference now to FIG. 6(*b*), a flex circuit 604 may be applied to each elevation strip in the transducer array.

Flex circuit 604 suitably includes a number of signal lead sections 606 separated by insulating/isolating regions 612. Signal lead sections 606 suitably correspond to individual transducer elements. An example of a flex circuit is available from the Unicircuit corporation, which includes a number of conductor leads 606 embedded in a polymide or similar film. Of course, any signaling leads, circuits or other schemes could be used in altermate embodiments. For example, individual leads could be suitably positioned and connected to each element in the transducer.

Flex circuit bus 604 may be aligned to the substrate assembly 500 by any technique. In exemplary embodiments, a "v-notch" 608 may be laser-etched or otherwise marked on flex circuit bus 604 prior to placement. Although various configurations of the v-notch could be formulated, one embodiment involves making a line from a center of at least one conductor lead 606 to the edge of the lead. Alternatively, an arrow or other marker could be made on flex circuit bus 604 that may be aligned with one of the minor element cuts 602 in substrate assembly 500. Alignment may take place by viewing the minor element cuts 602 and v-notch 608 through a microscope or other viewing device to properly position flex circuit bus 604 as appropriate. Flex circuit bus 604 may be affixed to substrate assembly 500 by soldering the leads to a metallized surface of the elements, by affixing with glue, epoxy or other adhesive, or by any other technique.

After the signal lines 606 are attached to substrate assembly 500, major element cuts 610 in the elevation direction may be made. With reference now to FIG. 6(*c*), major element cuts 610 may be made with a dicing saw or other device to isolate the various elements in the azimuth direction. Like the minor element cuts 602, major element cuts 610 may be made through the entire substrate assembly 500 to completely isolate the various elements. Alternatively, major element cuts 610 may be made only part of the way through substrate assembly 500, for example to conducting layer 108 (FIG. 1). In various embodiments, the kerf width of major element cuts 610 may be equal to or wider than the kerf width of minor element cuts 602. Although any kerf width could be used, an exemplary embodiment uses a kerf width of about 50 microns to isolate the various elements in the azimuth direction. The use of narrow sub-element kerfs and wider major element kerfs may contribute to maintaining the overall element aspect ratio, which influences thickness mode elemental response, and may also reduce inter-element cross-talk due to the wider gap between adjacent elements. In the exemplary embodiment shown in FIG. 6(*c*), major element cuts are made through flex circuit 604 from elevation isolation cut 504 into the insulation/isolation regions 612 of flex circuit 604, as appropriate, to suitably electrically isolate the leads 606 connected to each individual element.

Figure 7:
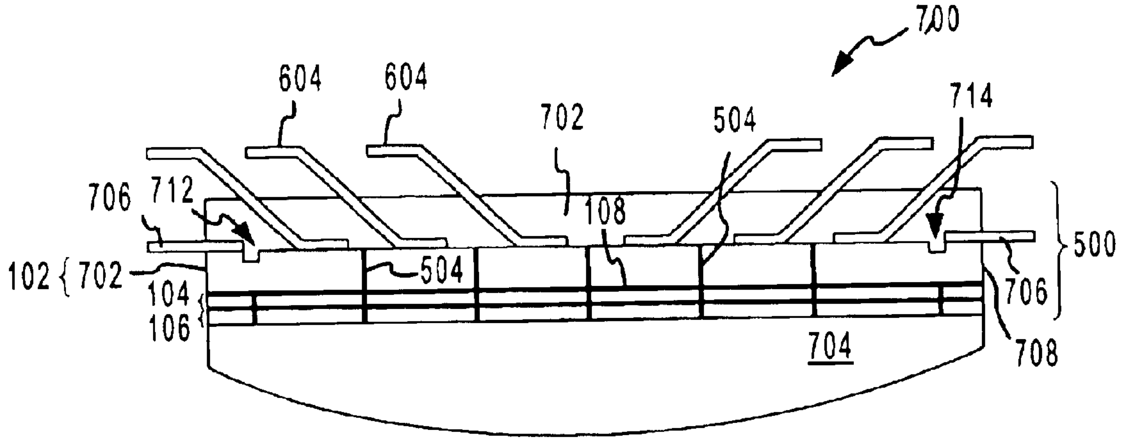
FIG. 7 is a side view of an exemplary transducer.

After the various elements in substrate assembly 500 have become isolated in both the elevation and azimuth dimensions, assembly 500 may be placed into a transducer housing (step 216 of FIG. 2). FIG. 7 is a cross-sectional view of an exemplary transducer 700 having a transducer assembly 500 as described above in conjunction with one or more ground leads 706, a backing material 702, and an acoustic lens 704. In the embodiment shown in FIG. 7, six elements are present in the elevation dimension, although of course more or fewer elements could be used in various other embodiments.

To create an acoustic lens 704, a facing material may be placed on the front face of the transducer next to the acoustic matching layers. Any suitable facing material such as silicon rubber or polyurethane may be used. Various forms of facing materials act as lenses to focus the acoustic layer to a specific focal point, and may also serve as a protective seal. Alternatively, the acoustic matching layers and/or piezoelectric layers may be suitably curved, angled or otherwise fashioned to focus radiation (such as ultrasonic radiation). In such embodiments, a separate acoustic lens 704 may or may not be utilized.

A backing material 702 may be placed on the substrate opposite the acoustic matching layers to dampen reflections received from the face of transducer 700. Suitable backing materials include polymers, epoxies and the like. Exemplary polymers filled with, for example, aluminum oxide or tungsten oxide may also be used. Backing material 702 may be cast over the ceramic layer to encapsulate the transducer elements and the corresponding signal and ground leads. Backing material 702 suitably absorbs and/or isolates sound waves generated from the ceramic layer to preserve appropriate bandwidth for the desired transducer.

Signal ground leads 706 may be electrically coupled to piezoelectric assembly 400. As shown in FIG. 7, the ends 708 and 710 of piezoelectric assembly 400 have been metallized (for example, during step 204 (FIG. 2)) so that the common ground provided by conducting layer 108 is electrically connected to the front face of piezoelectric assembly 400.

Figure 8:
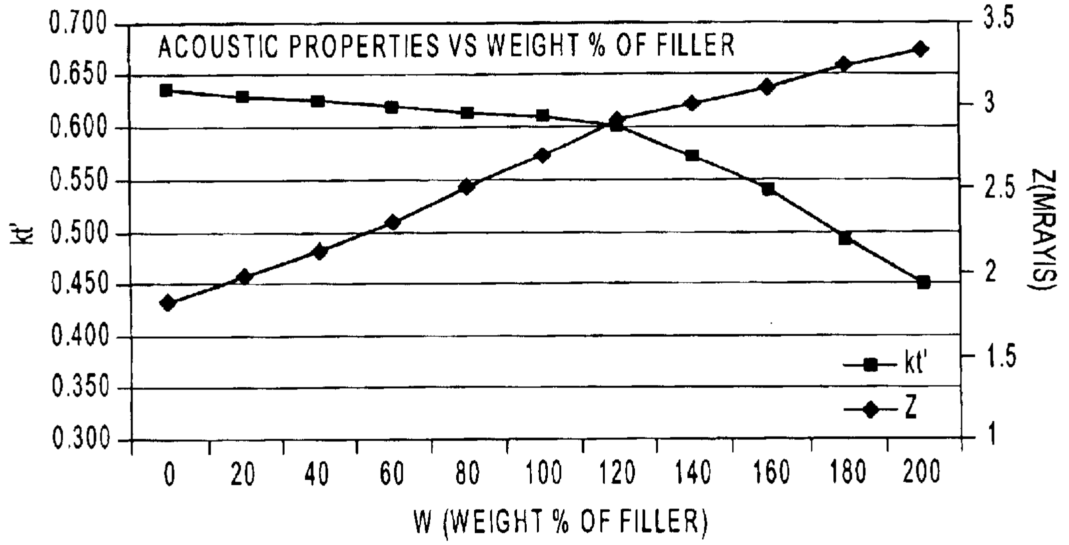
FIG. 8 is a plot of acoustic properties versus filler percentage for an exemplary transducer.
Figure 9:
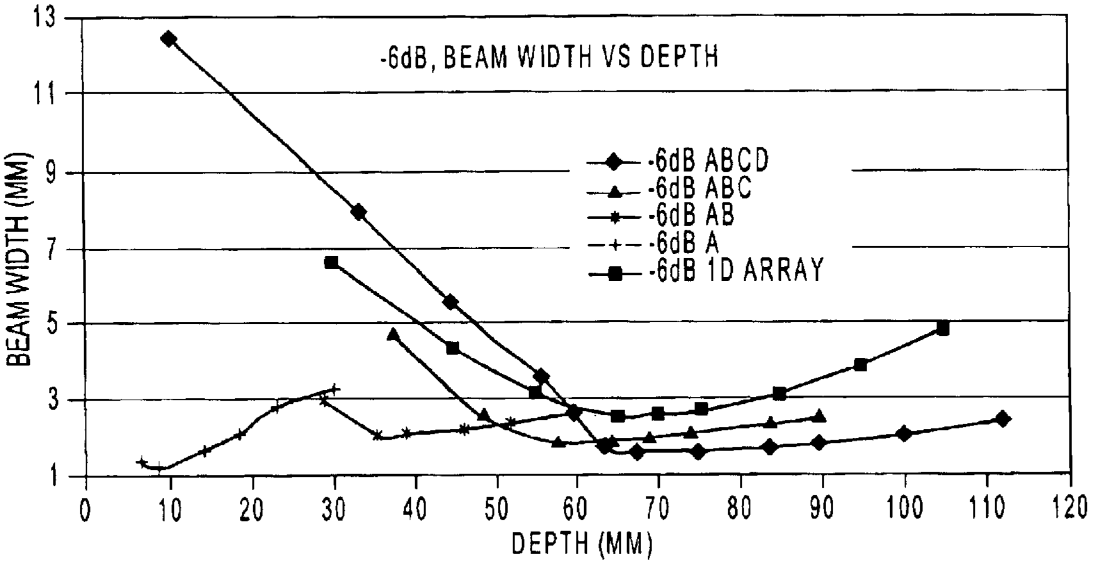
FIG. 9 is a plot of beam width versus depth for an exemplary transducer.

FIGS. 8 and 9 provide additional design detail for exemplary transducers. With reference to FIG. 8, a plot of two acoustic properties (thickness mode electromechanical coupling factor (kt') and acoustic impedance (Z)) for various weight fractions of filler (which may be any sort of filler material such as aluminum oxide, tungsten oxide, or the like) in the acoustically-attenuative material. Generally speaking, it may be desirable to minimize impedance (Z) for polymers used in matching layers and to maximize impedance (Z) for use in piezoelectric layers. As can be seen from the figure, various concentrations of filler produce different acoustic effects, and the particular effect desired for a particular transducer may vary widely from embodiment to embodiment.

With reference to FIG. 9, a plot of beam width versus depth is provided for a seven elevation strip transducer with one, three, five and seven elevation elements activated, respectively. A plot for a single dimensional array is also provided for comparison. As can be seen from the figure, the combined elevation beam profile using all four apertures provides a <3 millimeter beam width ranging from 6 millimeters to 150 millimeters, along with higher resolution and a very large depth of field. Of course this plot represents exemplary results for one embodiment; results obtained from other transducers may vary significantly.

No elements or components are necessary to the practice of the invention unless expressly described herein as "required" or "essential". The corresponding structures, materials, acts and equivalents of all elements in the claims below are intended to include any structure, material or acts for performing the functions in combination with other claimed elements as specifically claimed. Moreover, the steps recited in any method claims may be executed in any order. The scope of the invention should be determined by the appended claims and their legal equivalents, rather than by the examples given above.

What is claimed is:

1. A 1.5 dimensional transducer having a plurality of elements, said transducer comprising:

a conductor;

a piezo-electric assembly on a first side of said conductor, said piezo-electric assembly having a first plurality of cuts in a first direction;

a matching layer assembly having a second plurality of aperture cuts in said first direction, wherein said matching layer is coupled to said conductor opposite said piezo-electric assembly such that said first and second pluralities of elevation cuts are aligned to isolate said plurality of elements in an elevation dimension, wherein said conductor is not severed by said first and second plurality of cuts, wherein said transducer further comprises a plurality of major element cuts in a second direction, and wherein said plurality of major element cuts are made in said piezoelectric assembly and said matching layer assembly, and sever said conductor.

2. A multi-dimensional transducer according to claim 1 wherein each of said first and second pluralities of cuts is filled with an acoustically-attenuative material.

3. A multi-dimensional transducer according to claim 1 wherein a flex circuit is attached to at least one of said plurality of elements.

4. A multi-dimensional transducer having a plurality of elements, said transducer comprising:

a conductor, a piezo-electric assembly on a first side of said conductor, said piezo-electric assembly having a first plurality of cuts in a first direction;

a matching layer assembly having a second plurality of aperture cuts in said first direction, wherein said matching layer is coupled to said conductor opposite said piezo-electric assembly such that said first and second pluralities of elevation cuts are aligned to isolate said plurality of elements in an elevation dimension, wherein each of said first and second pluralities of cuts is filled with an acoustically-attenuative material, wherein said piezo-electric assembly further comprises a plurality of cuts in a second direction, wherein said plurality of cuts in said second direction comprise major element cuts that isolate said plurality of elements in an azimuth direction, and wherein said plurality of cuts in said second direction further comprises a plurality of minor element cuts.

5. A multi-dimensional transducer according to claim 4 further comprising a plurality of signal leads, wherein each of said plurality of signal leads is coupled to one of said plurality of elements.

6. A multi-dimensional transducer according to claim 5 wherein said plurality of signal leads comprises a flex circuit.

7. A multi-dimensional transducer according to claim 6 wherein said flex circuit is coupled to said transducer prior to the cutting of said plurality of major element cuts.

* * * * *